United States Patent
Iwamoto

(10) Patent No.: US 9,305,900 B2
(45) Date of Patent: Apr. 5, 2016

(54) SEMICONDUCTOR DEVICE AND MEMORY DEVICE

(71) Applicant: KABUSHIKI KAISHA TOSHIBA, Tokyo (JP)

(72) Inventor: Masaji Iwamoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 108 days.

(21) Appl. No.: 14/194,398

(22) Filed: Feb. 28, 2014

(65) Prior Publication Data

US 2015/0069633 A1 Mar. 12, 2015

(30) Foreign Application Priority Data

Sep. 11, 2013 (JP) ................................. 2013-188501

(51) Int. Cl.
*H01L 25/065* (2006.01)

(52) U.S. Cl.
CPC ........ *H01L 25/0657* (2013.01); *H01L 25/0652* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2225/0651* (2013.01); *H01L 2225/06562* (2013.01); *H01L 2924/15311* (2013.01)

(58) Field of Classification Search
CPC .................. H01L 25/0657; H01L 2225/0651; H01L 2224/73265; H01L 2224/32145; H01L 2224/48227; H01L 2924/00012; H01L 2224/32225; H01L 2924/15311
See application file for complete search history.

(56) References Cited

U.S. PATENT DOCUMENTS

| | | | |
|---|---|---|---|
| 7,296,754 B2 * | 11/2007 | Nishizawa et al. | 235/492 |
| 2005/0139985 A1 * | 6/2005 | Takahashi | 257/698 |
| 2009/0057723 A1 * | 3/2009 | Kaneko et al. | 257/209 |
| 2011/0316134 A1 * | 12/2011 | Ishii et al. | 257/676 |
| 2013/0114323 A1 * | 5/2013 | Shindo et al. | 365/63 |

* cited by examiner

*Primary Examiner* — Roy Potter
(74) *Attorney, Agent, or Firm* — Patterson & Sheridan, LLP

(57) ABSTRACT

A semiconductor device includes a substrate, a controller chip, and memory chips. Wiring is formed on the substrate. The controller chip has a rectangular surface area, and is mounted on the substrate. The memory chips have quadrangular surface areas, and are superposed on the substrate on a first major side of the controller chip. The first major side defines a first direction and a first controller terminal block is formed along a first minor side thereof orthogonal to the first direction, and a second controller terminal block is formed along a second major side opposite to the first major side.

19 Claims, 6 Drawing Sheets

SEMICONDUCTOR DEVICE AND MEMORY DEVICE

CROSS-REFERENCE TO RELATED APPLICATION

This application is based upon and claims the benefit of priority from Japanese Patent Application No. 2013-188501, filed Sep. 11, 2013, the entire contents of which are incorporated herein by reference.

FIELD

Embodiments described herein relate generally to a semiconductor device and a memory device.

BACKGROUND

A semiconductor device having a controller and a memory chip mounted on a substrate is used as an exemplary semiconductor device equipped with a memory chip and a controller. In such semiconductor devices, a resin may be applied between the controller and the memory chip.

There is a need to reduce the cost of applying the resin between the controller and the memory chip. In addition, there is a need to increase the operational speed of the memory chip.

DETAILED DESCRIPTION

Embodiments provide a semiconductor device capable of increasing the operational speed of a memory chip while reducing cost of applying a resin between a controller and a memory chip.

In general, according to one embodiment, a semiconductor device includes a substrate, a controller chip and memory chips. Wiring is formed on the substrate. The controller chip has a rectangular surface area, and is mounted on the substrate. The memory chips have quadrangular surface areas, and are superposed on the substrate on a first major side of the controller chip. The first major side defines a first direction and a first controller terminal block is formed along a first minor side thereof orthogonal to the first direction, and a second controller terminal block is formed along a second major side opposite to the first major side.

A semiconductor device according to an embodiment will be described below in detail with reference to the accompanying drawings. It is not intended that the present disclosure is limited by this embodiment.

First Embodiment

Figure 1:
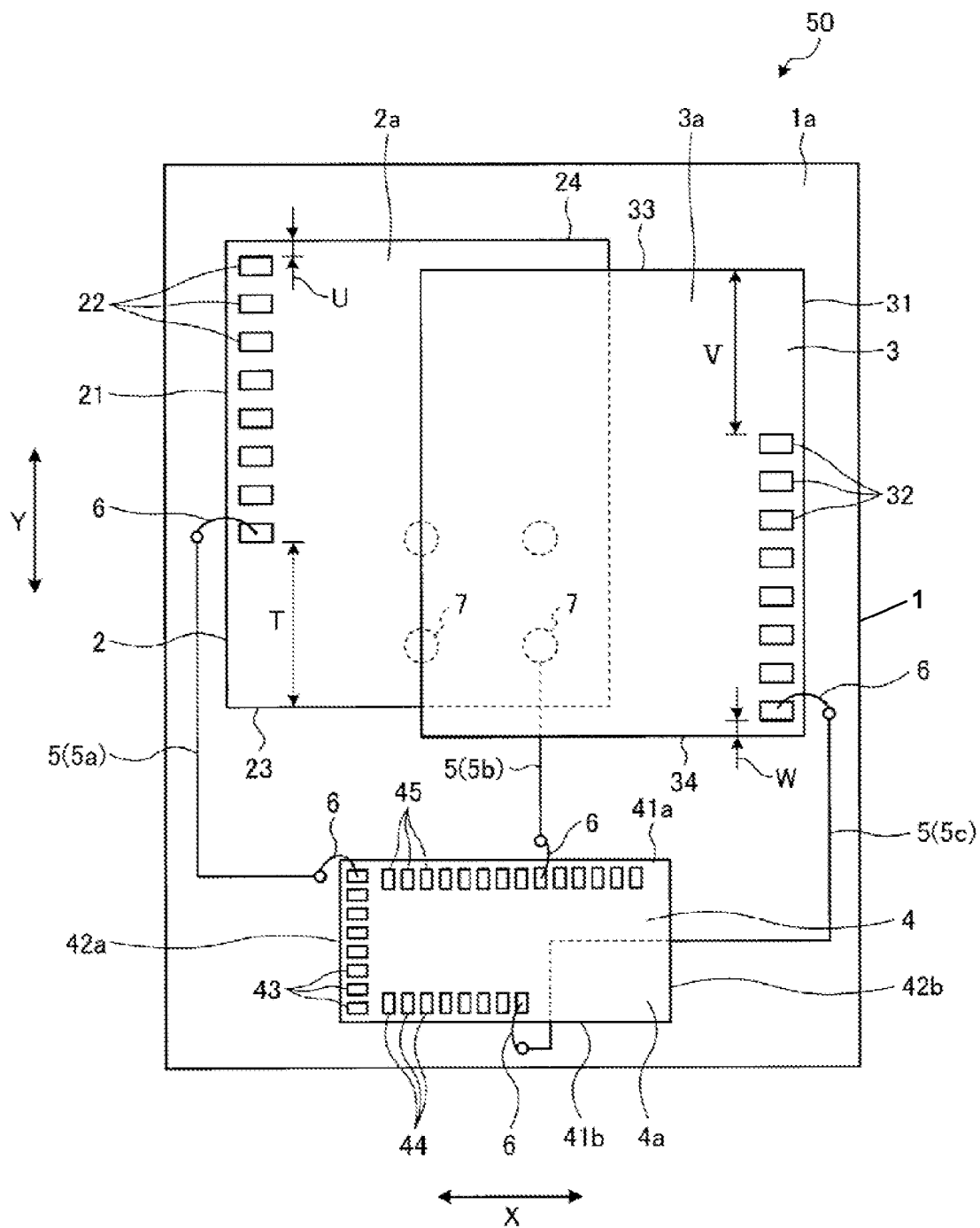
FIG. 1 is a plan view illustrating a schematic internal configuration of a semiconductor device according to a first embodiment.
Figure 2:
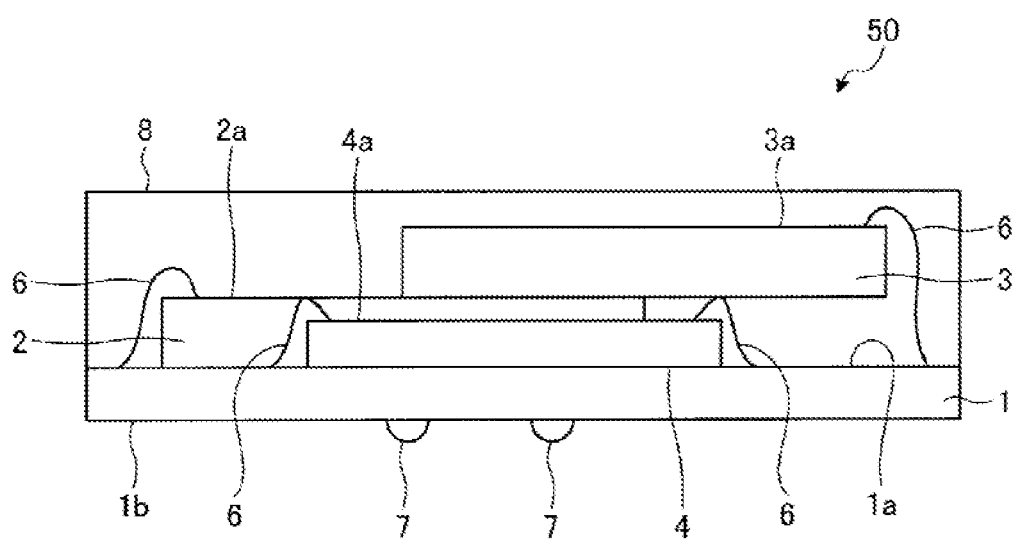
FIG. 2 is a side view of the semiconductor device shown in FIG. 1 as seen from the side of a controller chip.

FIG. 1 is a plan view illustrating a schematic internal configuration of a semiconductor device according to a first embodiment. FIG. 2 is aside view of the semiconductor device shown in FIG. 1 as seen from a side of a controller chip. A semiconductor device (memory device) 50 includes a substrate 1 (shown in FIG. 2), a first memory chip (first nonvolatile semiconductor storage element) 2, a second memory chip (second nonvolatile semiconductor storage element) 3 and a controller chip (semiconductor control element) 4.

The substrate 1 is a wiring substrate which has wiring 5 on the surface layer and the inner layer. The first memory chip 2 and the second memory chip 3 are nonvolatile semiconductor storage elements, such as a NAND flash memory. The first memory chip 2 and the second memory chip 3 have quadrangular surfaces 2a and 3a, respectively, in plan view as shown in FIG. 1.

The controller chip 4 is a semiconductor control element for controlling the first memory chip 2 and the second memory chip 3. For example, the controller chip 4 controls writing/reading of data to/from the first memory chip 2 and the second memory chip 3. The controller chip 4 has a rectangular surface 4a in plan view as shown in FIG. 1.

In the following description, among sides of the surface 4a of the controller chip 4, one long side is referred to as a first major side 41a and the other long side is referred to as a second major side 41b. Further, among sides of the surface 4a of the controller chip 4, one short side is referred to as a first minor side 42a and the other short side is referred to as a second minor side 42b. Furthermore, it is assumed that a direction along the first major side 41a of the controller chip 4 is a direction parallel to the direction shown by the arrow X (first direction) and the direction along the first minor side 42a is a direction parallel to the direction shown with the arrow Y (second direction).

The controller chip 4, the first memory chip 2 and the second memory chip 3 are mounted on a mounting surface 1a of the substrate 1 so that the surfaces 4a, 2a and 3a are positioned opposite to the mounting surface 1a of the substrate 1. The first major side 41a of the controller chip 4 faces the first memory chip and the second memory chip 3. The peripheries of the memory chips 2 and 3 and the controller chip 4 on the mounting surface 1a of the substrate 1 are sealed within a resin mold part 8. The resin mold part 8 is omitted in FIG. 1 in order to show the internal configuration of the semiconductor device 50. Further, the resin mold part 8 is shown as a transparent layer in FIG. 2 in order to show the internal configuration of the semiconductor device 50.

Since the memory chips 2 and 3 and the controller chip 4 are arranged in a layered or overlapping configuration on the substrate 1, the process for filling spaces between the memory chips 2 and 3 and the controller chip 4 with resin is eliminated since the memory chips 2 and 3 are superposed, allowing the manufacture cost to be reduced.

A first controller terminal block (first control element terminal block) 43 is formed on the surface 4a of the controller chip 4 adjacent one first minor side 42a thereof orthogonal to the arrow X. Further, a second controller terminal block (second control element terminal block) 44 is formed adjacent the second major side 41b opposite to the first major side 41a. Furthermore, a third controller terminal block (third control element terminal block) 45 is formed adjacent the first major side 41a as a terminal block other than the first controller terminal block 43 and the second controller terminal block 44. Therefore, no terminal block is formed in the area along the second minor side 42b.

The first to third controller terminal blocks 43 to 45 are terminal (electrode pad) blocks for connecting bonding wire 6. The first to third controller terminal blocks 43 to 45 are electrically connected to the wiring 5 through the bonding wire 6 to the controller 4.

The first memory chip 2 and the second memory chip 3 are superposed (stacked but offset) on the mounting surface 1a of the substrate 1. A first memory terminal block (first storage element terminal block) 22 is formed on the surface 2a of the first memory chip 2 adjacent one side 21 that is orthogonal to the arrow X. A distance U between the first memory terminal block 22 and a side 24 thereof opposite to the controller chip 4 is less than a distance T between the first memory terminal block 22 and a side 23 on the controller chip 4 side. In other words, the first memory terminal block 22 is closer to the side 24 than the side 23.

The first memory terminal block 22 is a terminal (electrode pad) for connecting the bonding wire 6. The first memory terminal block 22 is electrically connected to the wiring 5 through the bonding wire 6.

A second memory terminal block (second storage element terminal block) 32 is formed on a surface 3a of the second memory chip 3 adjacent a side 31 orthogonal to the arrow X. The second memory chip 3, which is the same as the first memory chip 2, is superposed on the first memory chip 2 so that the second memory chip 3 is rotated 180 degrees in a plane. Therefore, a distance W between the second memory terminal block 32 and a side 34 on the controller chip 4 side is less than a distance V between the second memory terminal block 32 and a side 33 opposite to the controller chip 4 side. In other words, the second memory terminal block 32 is closer to the side 34 than the side 33.

The second memory terminal block 32 is a terminal (electrode pad) for connecting the bonding wire 6 thereto. The second memory terminal block 32 is electrically connected to the wiring 5 through the bonding wire 6.

An external terminal 7 is formed on a rear face 1b opposite to the mounting surface 1a of the substrate 1. The external terminal 7 is electrically connected to the wiring 5 through a via (not shown) formed on the substrate 1.

Summarizing the electrical connection between each chip and each terminal, the first memory chip 2 and the controller chip 4 are electrically connected through the first memory terminal block 22, the wiring 5, the first controller terminal block 43 and the bonding wire 6. Further, the second memory chip 3 and the controller chip 4 are electrically connected through the second memory terminal block 32, the wiring 5, the second controller terminal block 44 and the bonding wire 6. Furthermore, the external terminal 7 and the controller chip 4 are electrically connected through the wiring 5, the third controller terminal block 45 and the bonding wire 6.

Next, the route of the wiring 5 which electrically connects each chip and each terminal with each other will be described in detail. Wiring 5a, which connects the controller chip 4 and the first memory chip 2, links the first minor side 42a side of the controller chip 4 and the side 21 side of the first memory chip 2.

Wiring 5b, which connects the controller chip 4 and the external terminal 7, links the first major side 41a of the controller chip 4 and the external terminal 7. The wiring 5b extends toward the external terminal 7 from the first major side 41a (the side that is closer to the external terminal 7) of the surface 4a of the controller chip 4, allowing the length of the wiring 5b to be shortened. This allows the operational speed of the semiconductor device 50 to be increased.

Wiring 5c, which connects the controller chip 4 and the second memory chip 3, links the second major side 41b side of the controller chip 4 and the side 31 of the second memory chip 3. The wiring 5c passes through an area overlapped by the controller chip 4 in a plan view (underneath the controller chip 4) and intersects the second minor side 42b in a plan view. Note that although a plurality of wirings 5a, 5b and 5c are provided to each electrode pad of a respective terminal block, only one representative wiring is described while the others are omitted for the purpose of simplification of the diagram. Also, wirings are preferably formed as conductive traces on the mounting surface 1a of the mounting substrate 1.

Here, in the present embodiment, no terminal block is formed in the area along the second minor side 42b of the surface 4a of the controller chip 4. If a terminal block is formed in the area along the second minor side 42b, it is necessary that an electrode pad which connects the bonding wire, and wiring which extends therefrom are formed in the vicinity of the second minor side 42b of the controller chip 4 on the mounting surface 1a of the substrate 1. In this case, if the wiring 5c is formed so as to intersect the second minor side 42b, the number of substrate layers may have to be increased in order to bypass an electrode pad, or the like, formed on the substrate.

On the other hand, in the present embodiment, since no terminal block is formed in the area along the second minor side 42b as described above, it is not necessary that an electrode pad which connects the bonding wire, and wiring which extends therefrom, are formed in the vicinity of the second minor side 42b of the controller chip 4 on the mounting surface 1a of the substrate 1. Therefore, the wiring 5c can be formed so as to intersect with the second minor side 42b without increasing the number of layers of the semiconductor device 50.

In addition, in the present embodiment, the second memory terminal block 32 is closer to the controller chip 4 than the first memory terminal block 22. Thus, the first controller terminal block 43 is formed in a location that is closer to a memory chip on the surface 4a of the controller chip 4, and the second controller terminal block 44 is formed in the location that is farther from the memory chip.

That is, as described above, the first controller terminal block 43 connected to the first memory terminal block 22 that is farther from the controller chip 4 is formed along the first minor side 42a that is closer to the first memory chip 2, and the second controller terminal block 44 connected to the second memory terminal block 32 that is closer to the controller chip 4 is formed along the second major side 41b that is farther from the second memory chip 3.

This allows the lengths of the wiring 5a and the wiring 5b to be reduced. The reduction of the lengths of the wiring 5a and the wiring 5b allows the operational speed of the first memory chip 2 and the second memory chip 3 to be increased.

Figure 3:
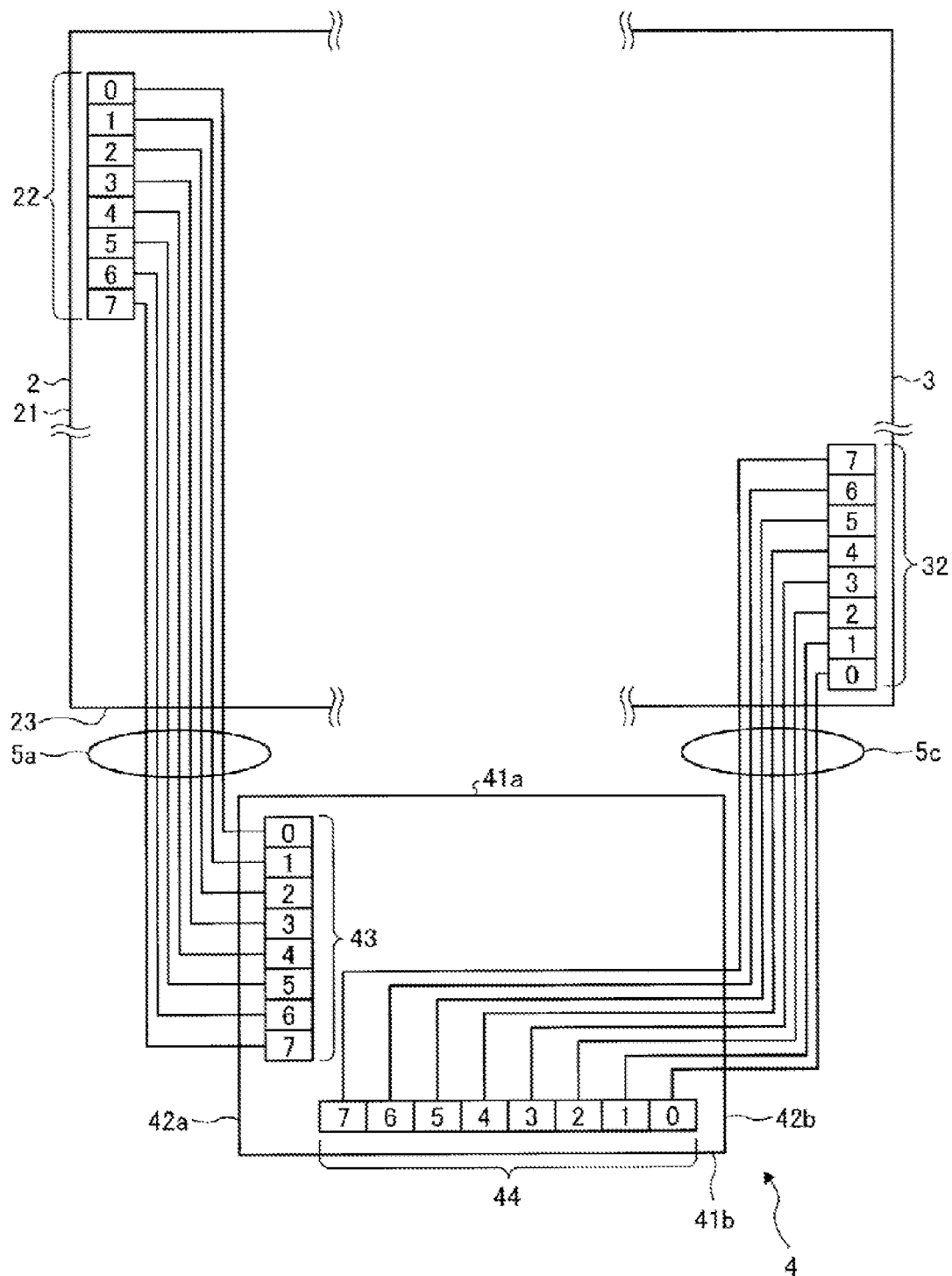
FIG. 3 is a schematic drawing illustrating the connection between terminal blocks formed on the surfaces of memory chips and the controller chip.

FIG. 3 is a schematic diagram illustrating the connection between terminal blocks formed on the surfaces of the memory chips 2 and 3 and the controller chip 4. As shown in FIG. 3, a terminal number is assigned to each terminal included in a terminal block, and terminals having the same terminal number are electrically connected to each other through the wiring 5.

In the present embodiment, data input/output terminal (I/O terminal) numbers (0 to 7) in the first controller terminal block 43, and data input/output terminal numbers (0 to 7) in the second controller terminal block 44 both decrease from the side closest to the corner where the first minor side 42a and the second major side 41b intersect each other.

As described above, since the first memory chip 2 and the second memory chip 3 are the same and are rotated 180 degrees with respect to each other in a plane, the first memory terminal block 22 and the second memory terminal block 32 have the terminal numbers reversed from one another along the direction shown with the arrow Y (shown in FIG. 1). For example, in FIG. 3, the first memory terminal block 22 has the data input/output terminal numbers (0 to 7) increasing from the terminal that is farthest from the controller chip 4 to the terminal that is closer to the controller chip 4. Conversely, in the second memory terminal block 32, the data input/output terminal numbers (0 to 7) decrease from the terminal that is farther from the controller chip 4 to the terminal that is closer to the controller chip 4.

Therefore, the first controller terminal block 43 and the first memory terminal block 22 have data input/output terminals connected through the wiring 5a, successively, from the terminal on the side that is closer to the first major side 41a for the first controller terminal block 43, and successively from the terminal on the side 24, which is the side opposite to the controller chip 4, for the first memory terminal block 22. On the other hand, the second controller terminal block 44 and the second memory terminal block 32 have data input/output terminals connected through the wiring 5c, successively, from the terminal on the side that is closer to the corner where the first minor side 42a and the second major side 41b intersect each other for the second controller terminal block 44, and successively from the terminal on the side 33, which is the side opposite to the controller chip 4, for the second memory terminal block 32. Therefore, the wirings 5a, which connect the first memory terminal block 22 and the first controller terminal block 43, can be formed without intersecting. Further, the wirings 5c, which connect the second memory terminal block 32 and the second controller terminal block 44, can be formed without intersecting. Therefore, an increase in the number of layers of the semiconductor device 50 due to intersection of the wirings 5a and 5c is not necessary, allowing manufacturing costs to be reduced.

When the assignments of the terminal numbers of the first memory terminal block 22 and the second memory terminal block 32 formed on the first memory chip 2 and the second memory chip 3, respectively, are reversed from the example shown in FIG. 3, the wirings 5a and 5c can be formed without intersection if the terminal numbers of the first controller terminal block 43 and the terminal numbers of the second controller terminal block 44 are such that both increase from the side that is closer to the corner where the first minor side 42a and the second major side 41b intersect.

Figure 4:
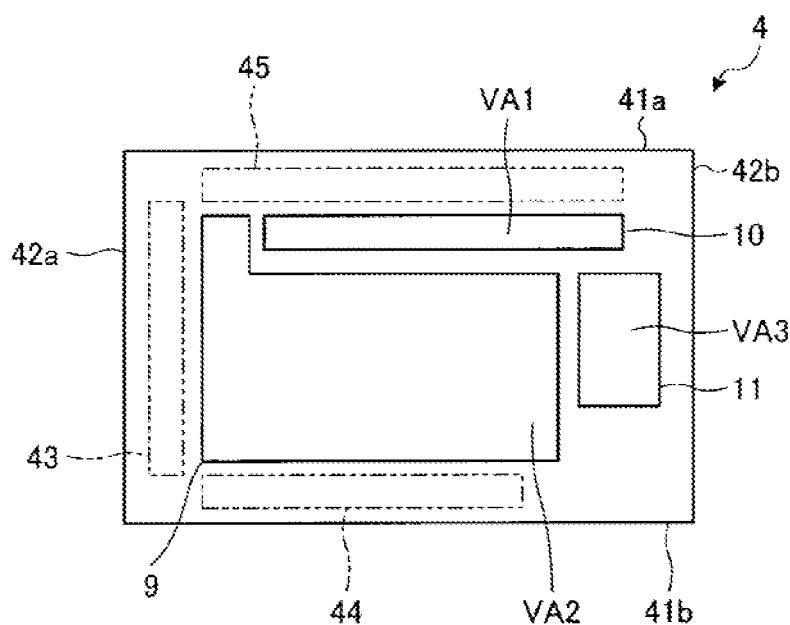
FIG. 4 is a drawing illustrating a circuit area formed on the controller chip.

Next, a circuit area formed on the controller chip 4 will be described. FIG. 4 is a drawing illustrating a circuit area formed on the controller chip 4. Various circuit areas are formed on the controller chip 4 including a circuit area VA1 controlling input and output of the third controller terminal block 45, a circuit area VA2 controlling input and output of the first controller terminal block 43 and the second controller terminal block 44, and a storage circuit area VA3 of the controller chip 4.

In the present embodiment, the first controller terminal block 43 and the second controller terminal block 44 are formed adjacent to each other along the first minor side 42a and the second major side 41b. Further, since the first controller terminal block 43 and the second controller terminal block 44 are both connected to memory chips, standby voltages and operating voltages in the circuit areas controlling the inputs and outputs of respective terminal blocks are equal. For example, in the standby state, in which no input/output to/from a memory chip is performed, the standby voltage is 0V, and in the operating state in which input/output of information to/from the memory chip is performed, the operating voltage is 1.2V.

Although the circuit areas VA1, VA2 and VA3 are placed so as to be adjacent to one another, since the first controller terminal block 43 and the second controller terminal block 44 are respectively formed along the first minor side 42a and the second major side 41b, which are adjacent to each other, and the standby voltage and the operating voltage are equal, with the circuit area VA2 controlling the input and output of the first controller terminal block 43 and the second controller terminal block 44 serving as one section, by surrounding the circuit area VA2 with a ground line 9, it is possible to separate a power supply line to the circuit area VA2 from power supply lines to the other circuit areas VA1, VA3.

Further, for example, in the circuit area VA1 controlling the input and output of the third controller terminal block 45, both of the standby voltage and the operating voltage are 1.2V. Furthermore, in the storage circuit area VA3 of the controller chip 4, the standby voltage is 0.8V, and the operating voltage is 1.2V. In this manner, the circuit areas VA1, VA2 and VA3 have different standby voltages. Therefore, by respectively surrounding the circuit area VA1 and the circuit area VA3 with ground lines 10 and 11 similarly to the circuit area VA2, it is possible to separate respective power supply lines to the circuit area VA1 and the circuit area VA3 from the power line to the circuit area VA2.

Figure 5:
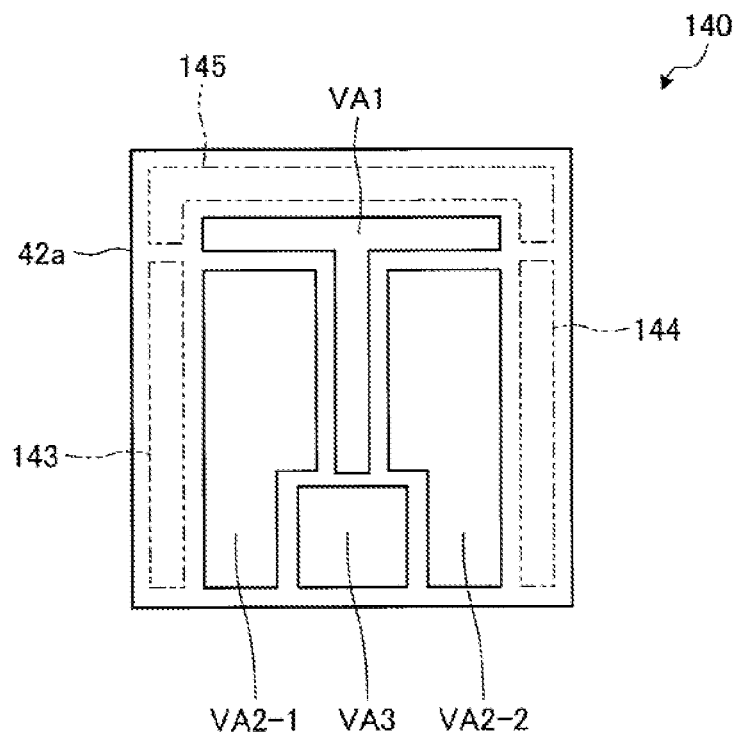
FIG. 5 is a drawing illustrating a circuit area formed on a controller chip shown as a comparative example.

FIG. 5 is a drawing illustrating a circuit area formed on a controller chip 140 shown as a comparative example. In the controller chip 140 shown as a comparative example, a first controller terminal block 143 and a second controller terminal block 144, which are connected to the memory chips (not shown), are formed along sides opposite to each other.

Here, it is necessary to separate a circuit area VA2-1 controlling the first controller terminal block 143 and a circuit area VA2-2 controlling the second controller terminal block 144 so that the circuit area VA1 controlling a third controller terminal block 145 and the storage circuit area VA3 of the controller chip 140 are adjacent to each other.

On the other hand, in the present embodiment, since the power supply can be separated into a circuit area controlling the first controller terminal block 43 and a circuit area controlling the second controller terminal block 44 as a single circuit area VA2, the planar area is VA2<(VA2-1)+(VA2-2). Therefore, the controller chip 4 according to the present embodiment may be downsized as compared to the controller chip 140 shown as a comparative example.

Figure 6:
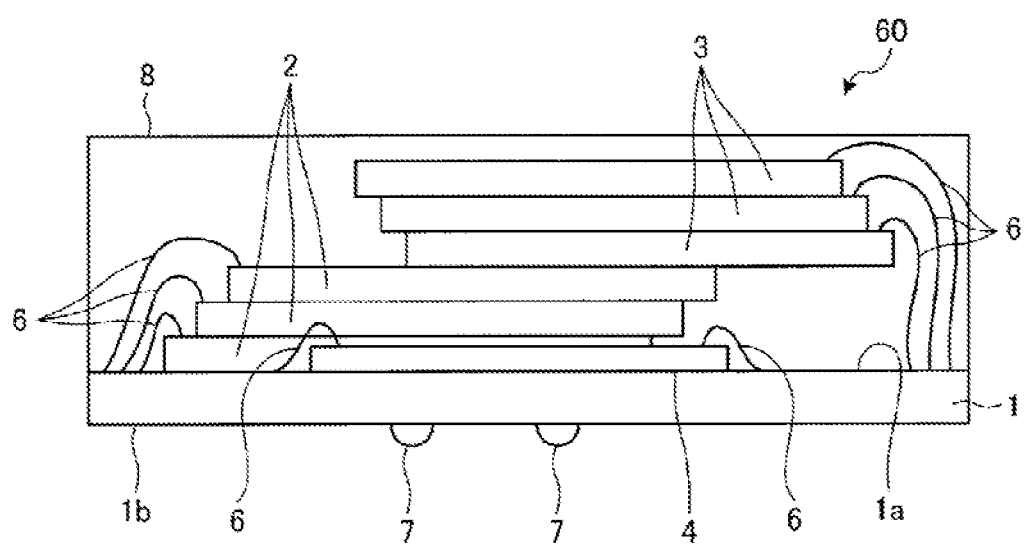
FIG. 6 is a side view of a semiconductor device according to a variation of the first embodiment as seen from the side of the controller chip.

FIG. 6 is a side view of a semiconductor device 60 according to a variation of the first embodiment seen from the side of the controller chip 4. Note that, in FIG. 6, the resin mold part 8 is shown as being transparent in order to show the internal configuration of the semiconductor device 60.

As shown in FIG. 6, a plurality of the first memory chips 2 and the second memory chips 3 may be superposed on the substrate 1. With this configuration, by increasing the number of memory chips, memory capacity can be increased while increasing the operational speed of the memory chip and downsizing the controller chip 4 similarly to the semiconductor device 50 described above may be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate having wiring formed thereon;
a controller chip having a rectangular shape in plan view mounted on the substrate so that a first major surface is opposite to the substrate; and
a plurality of memory chips having a quadrangular shape in plan view sequentially stacked on the substrate,
wherein a first direction is defined along a first major side of the controller chip in plan view, and a first controller terminal block is formed on the first major surface of the controller chip along a first minor side of the controller chip in a direction orthogonal to the first direction, and a second controller terminal block is formed on the first major surface of the controller chip along a second major side opposite to the first major side, and wherein
the plurality of memory chips include a first memory chip having a first memory terminal block formed along one side thereof that is orthogonal to the first direction, and a second memory chip having a second memory terminal block formed along one side thereof that is orthogonal to the first direction,
the first memory chip and the controller chip are electrically connected through the first memory terminal block and the first controller terminal block by the wiring, and
the second memory chip and the controller chip are electrically connected through the second memory terminal block and the second controller terminal block by the wiring.

2. The semiconductor device according to claim 1, wherein a first circuit area formed on the controller chip which controls the first controller terminal block and a second circuit area formed on the controller chip which controls the second controller terminal block are separated by a ground line.

3. The semiconductor device according to claim 1, wherein a distance between a side of the first memory terminal block opposite to the controller chip is less than a distance between a side of the first memory terminal block adjacent to the controller chip, and
a distance between a side of the second memory terminal block adjacent to the controller chip is less than a distance between a side of the second memory terminal block opposite to the controller chip.

4. The semiconductor device according to claim 3, wherein a first circuit area formed on the controller chip which controls the first controller terminal block and a second circuit area formed on the controller chip which controls the second controller terminal block are separated by a ground line to segregate power from other circuit areas.

5. The semiconductor device according to claim 1, wherein a third controller terminal block is formed along the first major side on the first major surface of the controller chip,
an external terminal is formed on the substrate, and
the external terminal and the controller chip are electrically connected by the wiring and the third controller terminal block.

6. The semiconductor device according to claim 5, wherein a first circuit area formed on the controller chip which controls the first controller terminal block and a second circuit area formed on the controller chip which controls the second controller terminal block are separated by a ground line to segregate power from other circuit areas.

7. The semiconductor device according to claim 1, wherein the wiring that electrically connects the second memory chip and the controller chip passes between the substrate and the controller chip.

8. The semiconductor device according to claim 7, wherein a first circuit area formed on the controller chip which controls the first controller terminal block and a second circuit area formed on the controller chip which controls the second controller terminal block are separated by a ground line.

9. The semiconductor device according to claim 7, wherein a distance between a side of the first memory terminal block opposite to the controller chip is less than a distance between a side of the first memory terminal block adjacent to the controller chip, and
a distance between a side of the second memory terminal block adjacent to the controller chip is less than a distance between a side of the second memory terminal block opposite to the controller chip.

10. A semiconductor device comprising:
a substrate having wiring formed thereon;
a controller chip having a rectangular shape in plan view mounted on the substrate so that a first major surface is opposite to the substrate; and
a plurality of memory chips having a quadrangular shape in plan view sequentially stacked on the substrate,
wherein a first direction is defined along a first major side of the controller chip in plan view, and a first controller terminal block is formed on the first major surface of the controller chip along a first minor side of the controller chip in a direction orthogonal to the first direction, and a second controller terminal block is formed on the first major surface of the controller chip along a second major side opposite to the first major side, and wherein
a third controller terminal block is formed along the first major side on the first major surface of the controller chip,
an external terminal is formed on the substrate, and
the external terminal and the controller chip are electrically connected by the wiring and the third controller terminal block.

11. A semiconductor device comprising:
a substrate having wiring formed thereon;
a controller chip having a rectangular shape in plan view mounted on the substrate so that a first major surface is opposite to the substrate; and
a plurality of memory chips having a quadrangular shape in plan view sequentially stacked on the substrate,
wherein a first direction is defined along a first major side of the controller chip in plan view, and a first controller terminal block is formed on the first major surface of the controller chip along a first minor side of the controller chip in a direction orthogonal to the first direction, and a second controller terminal block is formed on the first major surface of the controller chip along a second major side opposite to the first major side, and wherein
a first circuit area formed on the controller chip to control the first controller terminal block, and a second circuit area formed on the controller chip to control the second controller terminal block, are separated by a ground.

12. A semiconductor device comprising:
a substrate having wiring formed thereon;
a controller chip having a rectangular shape in plan view mounted on the substrate so that a first major surface is opposite to the substrate; and a plurality of memory chips having a quadrangular shape in plan view sequentially stacked on the substrate, wherein a first direction is defined along a first major side of the controller chip in plan view, and a first controller terminal block is formed on the first major surface of the controller chip along a first minor side of the controller chip in a direction orthogonal to the first direction, and a second controller terminal block is formed on the first major surface of the controller chip along a second major side opposite to the first major side, and wherein the plurality of memory chips include a first memory chip and a second memory chip;

the first controller terminal block and the memory terminal block of the first memory chip include data input/output terminals interconnected by wires extending from a terminal on a side of the first memory, and the second controller terminal block and the memory terminal block of the second memory chip have data input/output terminals interconnected by wires from a terminal on a side that is adjacent to a corner where the first minor side and the second major side intersect each other for the second controller terminal block, and from a terminal on a side opposing the controller chip.

13. A semiconductor device comprising:
a substrate having a mounting surface and a back surface opposing the mounting surface;
a controller chip having a first major surface and a rectangular shape in plan view mounted on the substrate opposing the back surface of the substrate; and
a plurality of memory chips having a quadrangular shape in plan view are sequentially stacked on the mounting surface of the substrate,
wherein a first direction is defined along a first major side of the controller chip in plan view, and a first controller terminal block is formed on the first major surface of the controller chip along a first minor side of the controller chip in a direction orthogonal to the first direction, and a second controller terminal block is formed on the first major surface of the controller chip along a second major side opposite to the first major side, and
wherein the first major side of the controller chip faces the plurality of memory chips.

14. The semiconductor device according to claim 13, wherein
the plurality of memory chips include a first memory chip and a second memory chip, each of the first memory chip and second memory chip having respective terminal blocks that are disposed in an opposing relation to each other.

15. The semiconductor device according to claim 14, wherein
the wiring that electrically connects the second memory chip and the controller chip passes between the substrate and the controller chip.

16. The semiconductor device according to claim 14, wherein
a first circuit area formed on the controller chip which controls the first controller terminal block and a second circuit area formed on the controller chip which controls the second controller terminal block are separated by a ground line to segregate power from adjacent circuit areas.

17. The semiconductor device according to claim 13, wherein
a distance between a side of the first memory terminal block opposite to the controller chip is less than a distance between a side of the first memory terminal block adjacent to the controller chip, and
a distance between a side of the second memory terminal block adjacent to the controller chip is less than a distance between a side of the second memory terminal block opposite to the controller chip.

18. The semiconductor device according to claim 17, wherein
a third controller terminal block is formed along the first major side on the first major surface of the controller chip,
an external terminal is formed on the substrate, and
the external terminal and the controller chip are electrically connected by a wiring and the third controller terminal block.

19. A memory device comprising:
a substrate having wiring and an external terminal formed thereon;
a semiconductor control element which has a rectangular shape in plan view mounted on the substrate so that a major surface thereof is opposite to the a back surface of the substrate;
a first nonvolatile semiconductor storage element which has a quadrangular shape in plan view mounted on a side of the substrate opposite to the back surface of the substrate; and
a second nonvolatile semiconductor storage element which has a quadrangular shape in a plan view superposed on the first nonvolatile semiconductor storage element, wherein
a first direction is defined along a first major side of the semiconductor control element in the plan view,
a first control element terminal block is formed on a surface of the semiconductor control element along one first minor side thereof that is orthogonal to the first direction, a second control element terminal block is formed on a surface of the semiconductor control element along a second major side opposite to the first major side, and a third control element terminal block is formed on a surface of the semiconductor control element along the first major side thereof,
a first storage element terminal block is formed on a surface of the first nonvolatile semiconductor storage element along a first side thereof that is orthogonal to the first direction,
a second storage element terminal block is formed on a surface of the second nonvolatile semiconductor storage element along a second side thereof that is orthogonal to the first direction,
the first nonvolatile semiconductor storage element and the semiconductor control element are electrically connected through the first storage element terminal block, the wiring and the first control element terminal block,
the second nonvolatile semiconductor storage element and the semiconductor control element are electrically connected through the second storage element terminal block, the wiring and the second control element terminal block,
the external terminal and the semiconductor control element are electrically connected through the wiring and the third control element terminal block, and
the first major side of the semiconductor control element faces the first and second nonvolatile storage elements.

* * * * *